US010600909B2

(12) United States Patent
Kumar et al.

(10) Patent No.: US 10,600,909 B2
(45) Date of Patent: Mar. 24, 2020

(54) SEMICONDUCTOR DEVICES AND METHODS FOR FABRICATING THE SAME (71) Applicant: Vanguard International Semiconductor Corporation, Hsinchu (TW)

(72) Inventors: Ankit Kumar, Ranchi (IN); Chia-Hao Lee, New Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/052,768

(22) Filed: Aug. 2, 2018

(65) Prior Publication Data
US 2020/0044081 A1 Feb. 6, 2020

(51) Int. Cl.
*H01L 29/78* (2006.01)
*H01L 29/10* (2006.01)
*H01L 29/08* (2006.01)
*H01L 29/66* (2006.01)
*H01L 21/02* (2006.01)
(Continued)

(52) U.S. Cl.
CPC .... *H01L 29/7824* (2013.01); *H01L 21/02532* (2013.01); *H01L 21/266* (2013.01); *H01L 21/26513* (2013.01); *H01L 29/0649* (2013.01); *H01L 29/0865* (2013.01);
(Continued)

(58) Field of Classification Search
CPC .............. H01L 29/7824; H01L 29/0649; H01L 29/7816; H01L 29/0882; H01L 29/0865; H01L 29/1095; H01L 29/66681; H01L 21/266; H01L 21/26513; H01L 21/02532
See application file for complete search history.

(56) References Cited

U.S. PATENT DOCUMENTS 6,734,493 B2    5/2004  Chen et al.
6,773,997 B2 *  8/2004  Imam ................. H01L 29/0634
                                                    438/286
(Continued)

FOREIGN PATENT DOCUMENTS

TW          201409692 A      3/2014

OTHER PUBLICATIONS

A Taiwanese Office Action and Search Report dated Mar. 28, 2019 in Taiwanese Application No. 107136543.

*Primary Examiner* — Galina G Yushina
(74) *Attorney, Agent, or Firm* — Birch, Stewart, Kolasch & Birch, LLP (57) ABSTRACT

A semiconductor device includes an epitaxial layer disposed over a semiconductor substrate, a drift region disposed in the epitaxial layer and adjacent to an upper surface of the epitaxial layer, a gate structure disposed over the epitaxial layer, a source region disposed in the epitaxial layer outside the drift region, and a drain region disposed in the drift region. The epitaxial layer and the drift region have a first conductivity type. The semiconductor device also includes a plurality of doped region pairs disposed in the drift region and arranged in a direction from the drain region toward the source region. Each of the plurality of doped region pairs includes a first doped region having a second conductivity type opposite to the first conductivity type, and a second doped region disposed over the first doped region. The second doped region has the first conductivity type.

18 Claims, 8 Drawing Sheets

(51) Int. Cl.
*H01L 21/265* (2006.01)
*H01L 21/266* (2006.01)
*H01L 29/06* (2006.01)

(52) U.S. Cl.
CPC ...... *H01L 29/0882* (2013.01); *H01L 29/1095* (2013.01); *H01L 29/66681* (2013.01); *H01L 29/7816* (2013.01)

(56) References Cited

U.S. PATENT DOCUMENTS

| | | | |
|---|---|---|---|
| 9,431,286 B1* | 8/2016 | Pendharkar | H01L 21/761 |
| 2001/0025961 A1* | 10/2001 | Nakamura | H01L 29/7393 |
| | | | 257/107 |
| 2015/0243766 A1* | 8/2015 | Tu | H01L 29/66681 |
| | | | 257/329 |

* cited by examiner

SEMICONDUCTOR DEVICES AND METHODS FOR FABRICATING THE SAME

BACKGROUND

Technical Field

The disclosure relates to semiconductor devices, and more particularly, to semiconductor devices having high breakdown voltage as well as very low on-resistance and methods for fabricating the same.

Description of the Related Art

Laterally diffused metal-oxide-semiconductor (LDMOS) devices are widely used in various applications. On-resistance is an important factor that is directly proportional to the power consumption of an LDMOS device. As the demand for power savings and better performance of electronic devices increase, manufacturers have continuously sought to reduce the leakage and on-resistance (Ron) of LDMOS devices. However, the reduction of on-resistance is closely related to high off-state breakdown voltage. Specifically, reducing the on-resistance leads to a substantial drop in the high off-state breakdown voltage. Thus, a conventional LDMOS device is able to deliver high off-state breakdown voltage but fails to provide low on-resistance.

An LDMOS device includes a drift region, and a body region. It has been observed that the on-resistance of the conventional LDMOS device decreases when the dopant concentration of the drift region increases. However, the high off-state breakdown voltage of the LDMOS decreases as the doping concentration increases.

Thus, an improved semiconductor device having low on-resistance without the deficiencies related to the breakdown voltage and a method for fabricating the same are needed.

SUMMARY

Some embodiments of the present disclosure provide a semiconductor device. The semiconductor device includes an epitaxial layer disposed over a semiconductor substrate, a drift region disposed in the epitaxial layer and adjacent to an upper surface of the epitaxial layer, a gate structure disposed over the epitaxial layer, a source region disposed in the epitaxial layer outside the drift region, and a drain region disposed in the drift region. The epitaxial layer has a first conductivity type. The drift region has the first conductivity type. The gate structure covers the drift region. The semiconductor device also includes a plurality of doped region pairs disposed in the drift region and arranged in a direction from the drain region toward the source region. Each of the plurality of doped region pairs includes a first doped region having a second conductivity type opposite to the first conductivity type, and a second doped region disposed over the first doped region. The second doped region has the first conductivity type.

Some embodiments of the present disclosure provide a method for fabricating a semiconductor device. The method includes forming an epitaxial layer over a semiconductor substrate, forming a plurality of doped region pairs in the epitaxial layer, forming a drift region in the epitaxial layer and adjacent to an upper surface of the epitaxial layer, wherein the plurality of doped region pairs are located in the drift region, forming a gate structure over the epitaxial layer, forming a source region in the epitaxial layer outside the drift region, and forming a drain region in the drift region. The epitaxial layer has a first conductivity type. The gate structure partially covers the drift region. The drift region has the first conductivity type. The plurality of doped region pairs are arranged in a direction from the drain region toward the source region. Each of the plurality of doped region pairs includes a first doped region having a second conductivity type opposite to the first conductivity type and a second doped region formed over the first doped region, wherein the second doped region has a first conductivity type.

A detailed description is given in the following embodiments with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn to scale, wherein.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of some embodiments are discussed below. Throughout the various views and illustrative embodiments, like reference numbers are used to designate like elements. It should be understood that additional operations can be provided before, during, and after the method, and some of the operations described can be replaced or eliminated for other embodiments of the method.

Although some embodiments are discussed with operations performed in a particular order, these operations may be performed in another logical order. In different embodiments, additional operations can be provided before, during, and/or after the stages described the present disclosure. Some of the stages that are described can be replaced or eliminated for different embodiments. Additional features can be added to the semiconductor structure in the present disclosure. Some of the features described below can be replaced or eliminated for different embodiments.

The embodiments of the present disclosure provide a semiconductor device including a plurality of doped region pairs disposed in a drift region, each of which has a first doped region and a second doped region disposed over the first doped region. The first doped region has a conductivity type opposite to that of the drift region, and the second doped region has a conductivity type that is the same as that of the drift region. The plurality of doped region pairs are arranged in a direction from a drain region toward a source region. Therefore, the plurality of doped region pairs maintains the breakdown voltage of the device while reducing the on-resistance of the semiconductor device.

Figure 1:
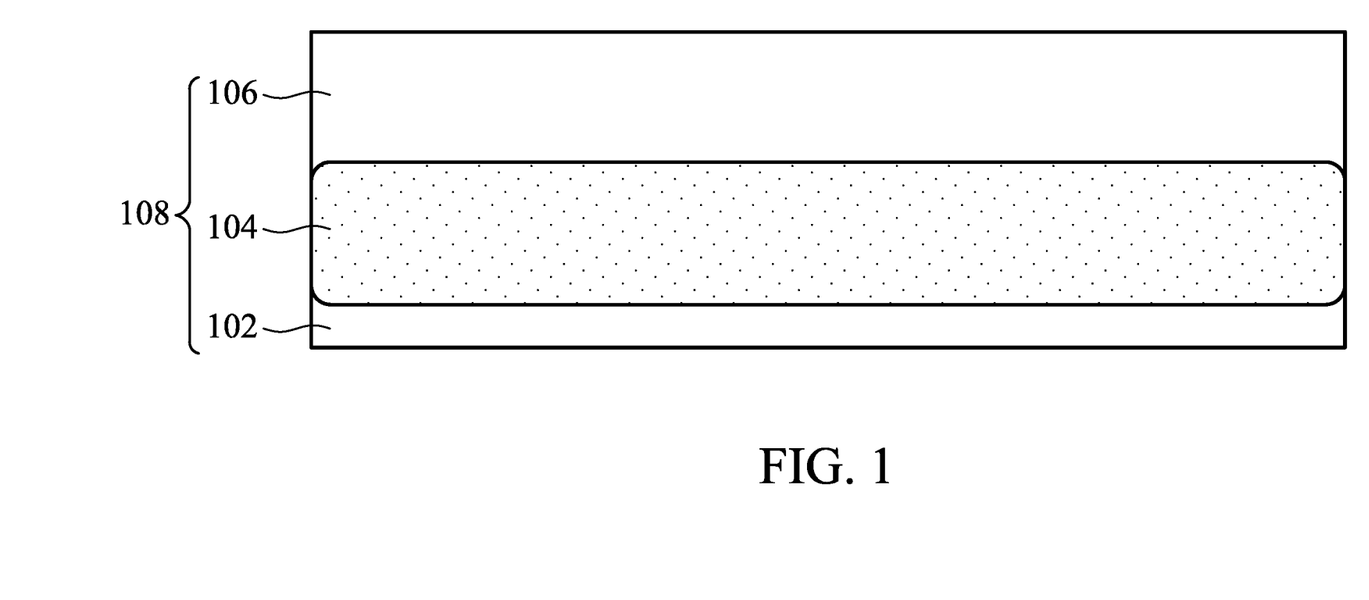
FIGS. 1-8 illustrate cross-sectional views of forming a semiconductor device at various intermediate stages in accordance with some embodiments of the present disclosure.
Figure 6:
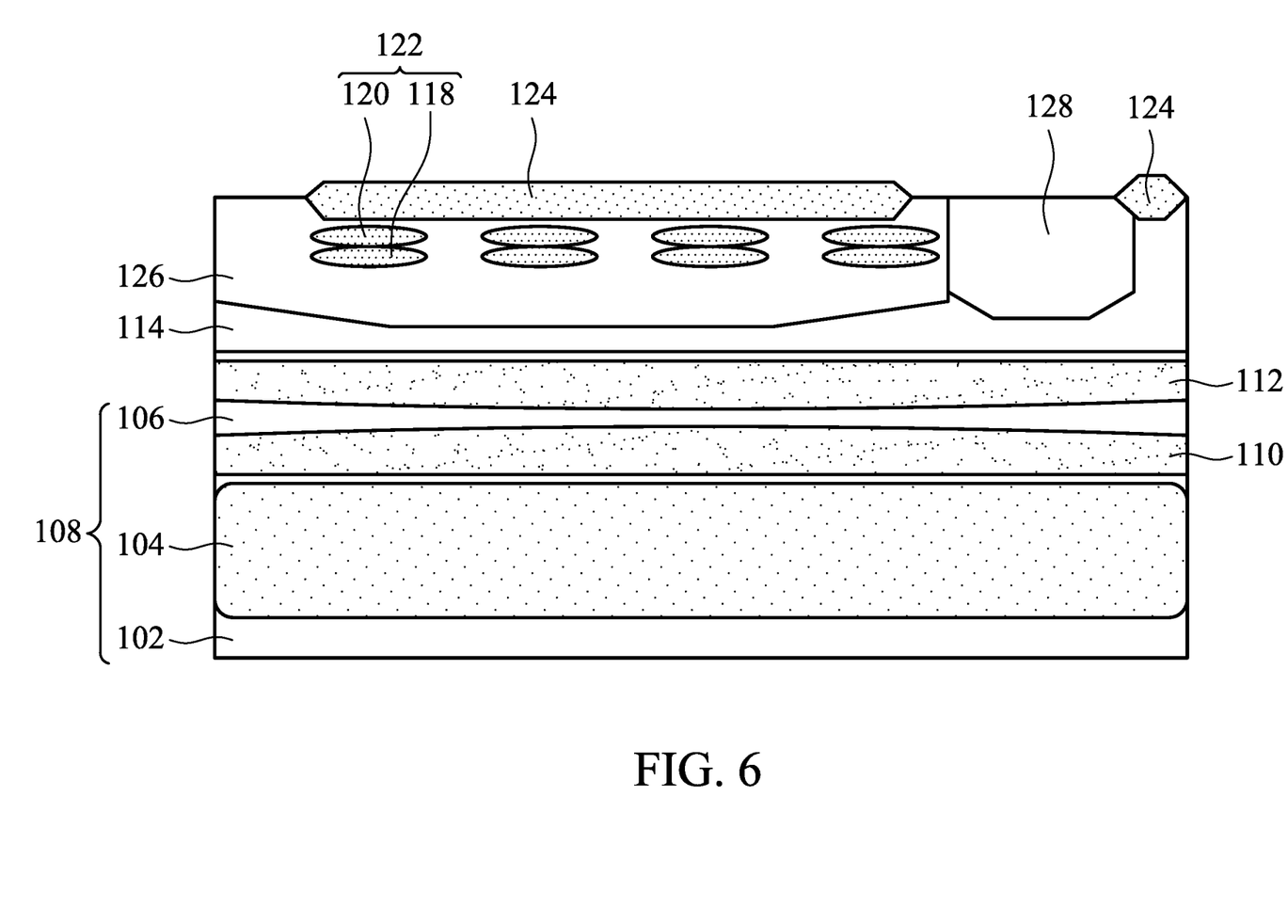
Figure 7:
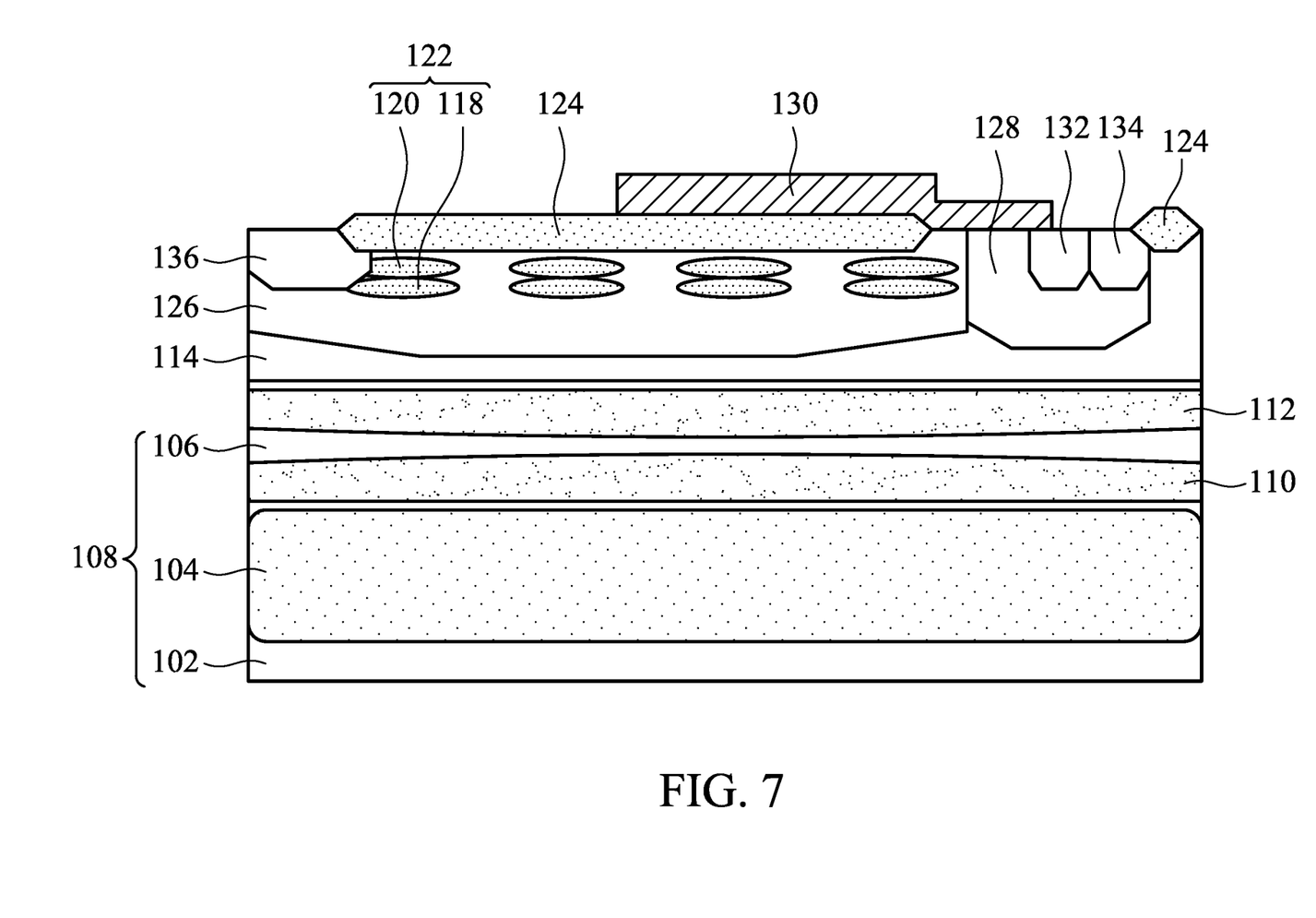
Figure 8:
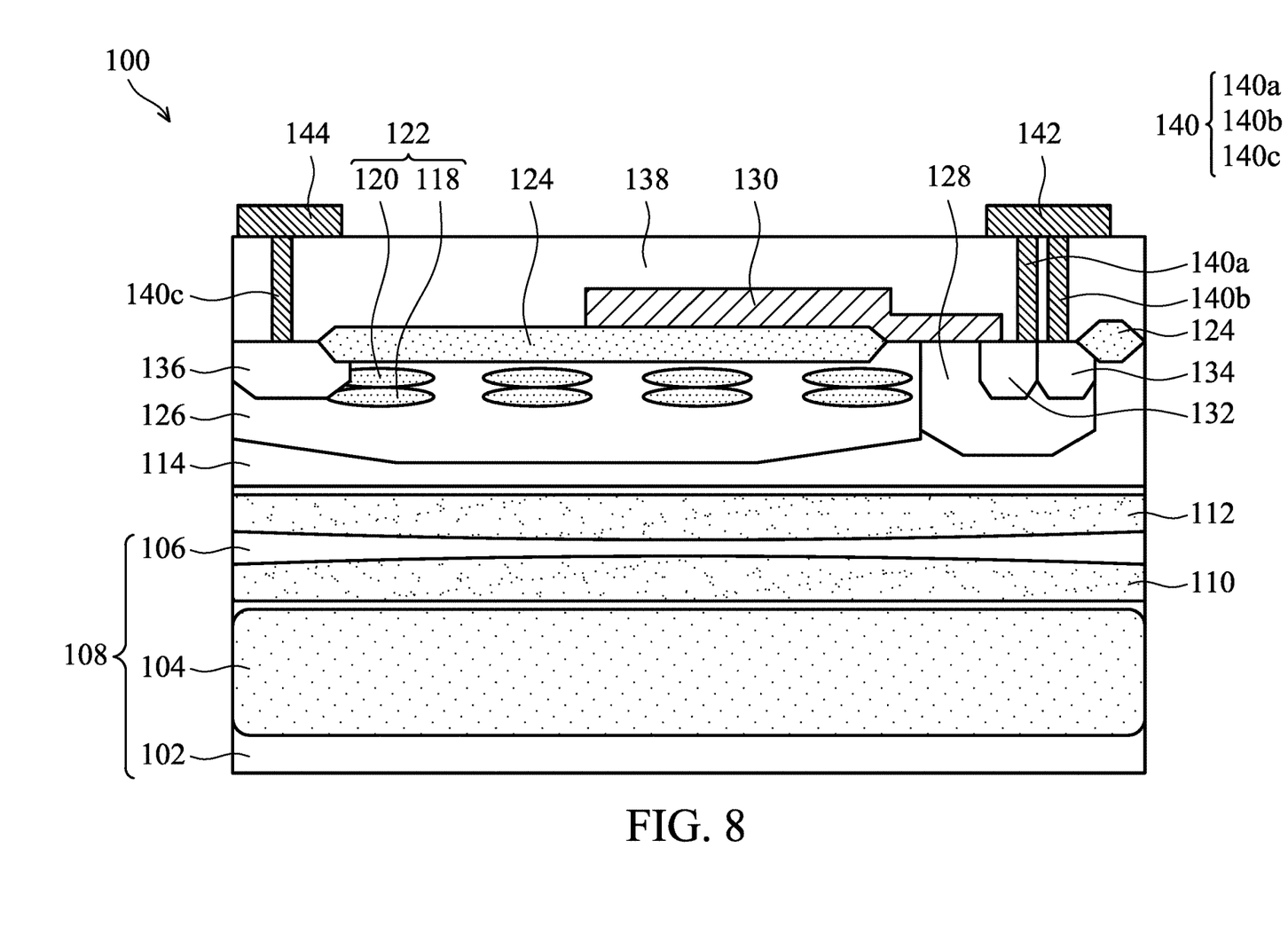

FIGS. 1-8 illustrate cross-sectional views of forming a semiconductor device 100 shown in FIG. 8 at intermediate stages in accordance with some embodiments of the present disclosure. Referring to FIG. 1, a semiconductor-on-insulator (SOI) substrate 108 is provided. The SOI substrate 108 includes an insulating layer 104 formed over a substrate 102, and a semiconductor layer 106 is formed over the insulating layer 104.

In some embodiments, the substrate 102 may be a semiconductor substrate such as a Si substrate. Moreover, the semiconductor substrate may also include other elementary semiconductors such as Ge; compound semiconductors such as GaN, SiC, GaAs, GaP, InP, InAs, and/or InSb; alloy semiconductors such as SiGe, GaAsP, AlinAs, AlGaAs, GaInAs, GaInP, and/or GaInAsP, or a combination thereof. In some embodiments, the substrate 102 has a first conductivity type. For example, the first conductivity type is N-type and the substrate 102 may be a phosphorous-doped or arsenic-doped substrate. In some other embodiments, the substrate 102 has a second conductivity type which is opposite to the first conductivity type. For example, the second conductivity type is P-type and the substrate 102 may be a boron-doped substrate. Although the first conductivity type is N-type and the second conductivity type is P-type in some embodiments, the present disclosure is not limited thereto. In some embodiments, the insulating layer 104 may be a buried oxide layer (BOX). In an embodiment, the substrate 102 has the second conductivity type, and the semiconductor layer 106 is has the first conductivity type.

In some embodiments, the SOI 108 may be formed by a separation by implantation of oxygen (SIMOX), a wafer bonding process, an epitaxial layer transfer process, other suitable processes, or a combination thereof. In some embodiments, the semiconductor layer 106 has a thickness in a range from about 1 µm to about 15 µm, and the insulating layer 104 has a thickness in a range from about 0.3 µm to about 5 µm.

Figure 2:
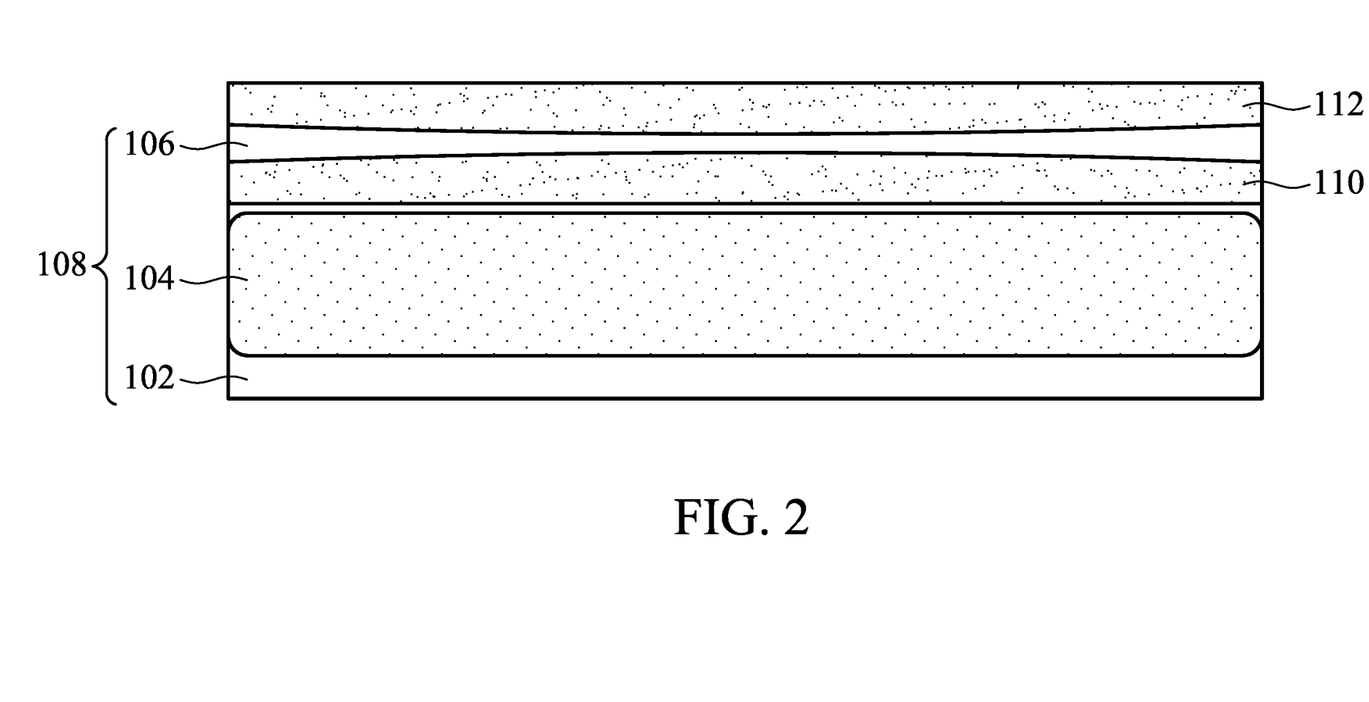

Referring to FIG. 2, a first buried layer 110 is formed in the semiconductor layer 106 and adjacent to the bottom surface of the semiconductor layer 106. A second buried layer 112 is formed over the first buried layer 110 in the semiconductor layer 106 and adjacent to the upper surface of the semiconductor layer 106. In some embodiments, the first buried layer 110 has the first conductivity type. The first conductivity type may be a P-type dopant such as B, Ga, Al, In, BF3+ ions, or a combination thereof. The second buried layer 112 has the second conductivity type opposite to the first conductivity type. The second conductivity type may be N-type dopant such as P, As, N, Sb ions, or a combination thereof. The dopant concentration of the first buried layer 110 and the second buried layer 112 may be of any range which may be optimized to eliminate the backside bias effect. If the dopant concentration is too high, the breakdown voltage may worsen.

Figure 3:
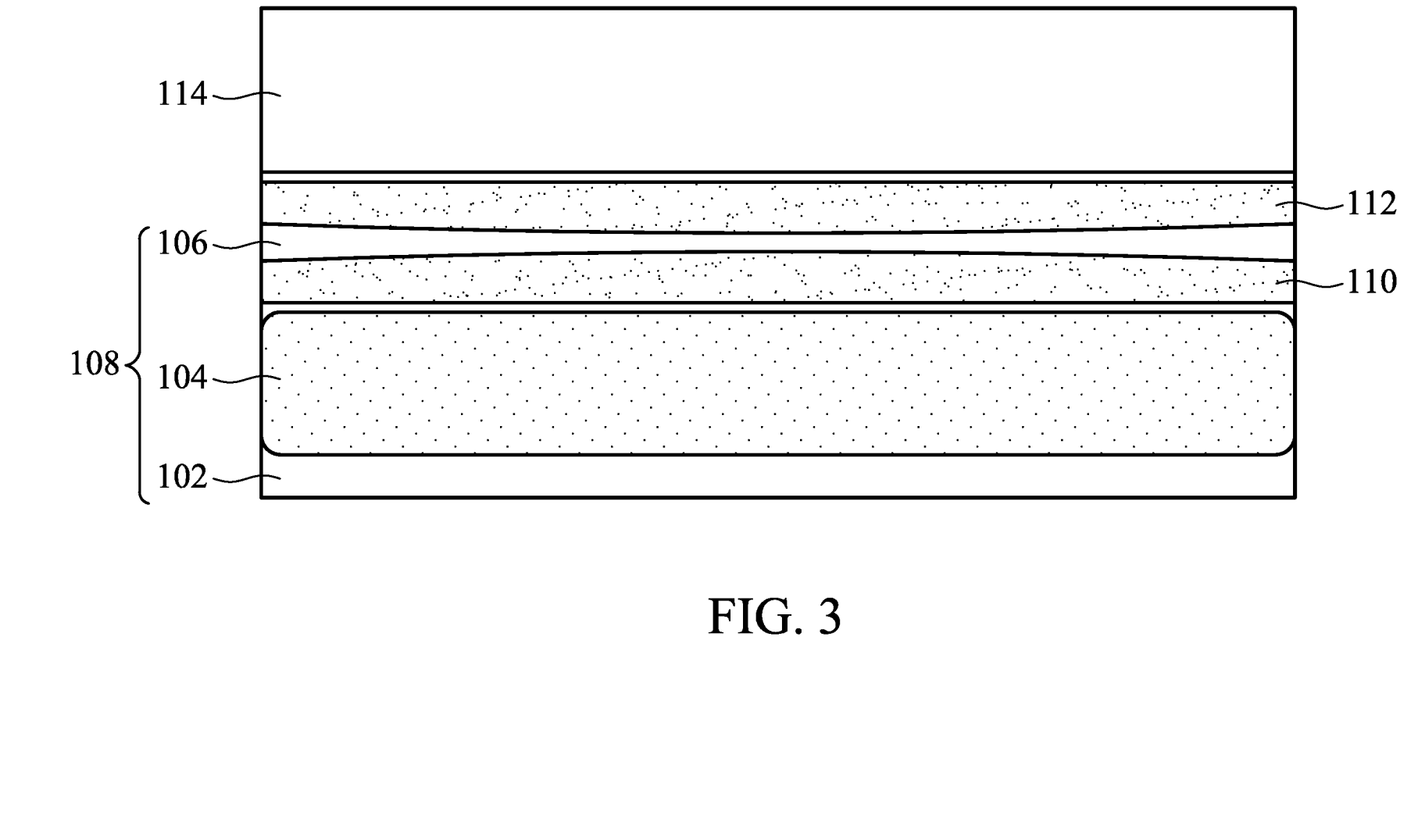

Referring to FIG. 3, an epitaxial layer 114 is formed over the SOI substrate 108. In some embodiments, the epitaxial layer 114 is made of silicon. In some embodiments, the epitaxial layer 114 has a first conductivity type, such as P-type. The epitaxial layer 114 may be formed over the semiconductor layer 106 by any suitable process such as molecular-beam epitaxy (MBE), metal organic chemical vapor deposition (MOCVD), hydride vapor phase epitaxy (HVPE), or a combination thereof. The epitaxial layer 114 may have a thickness in a range from about 2 µm to about 15 µm.

Figure 4:
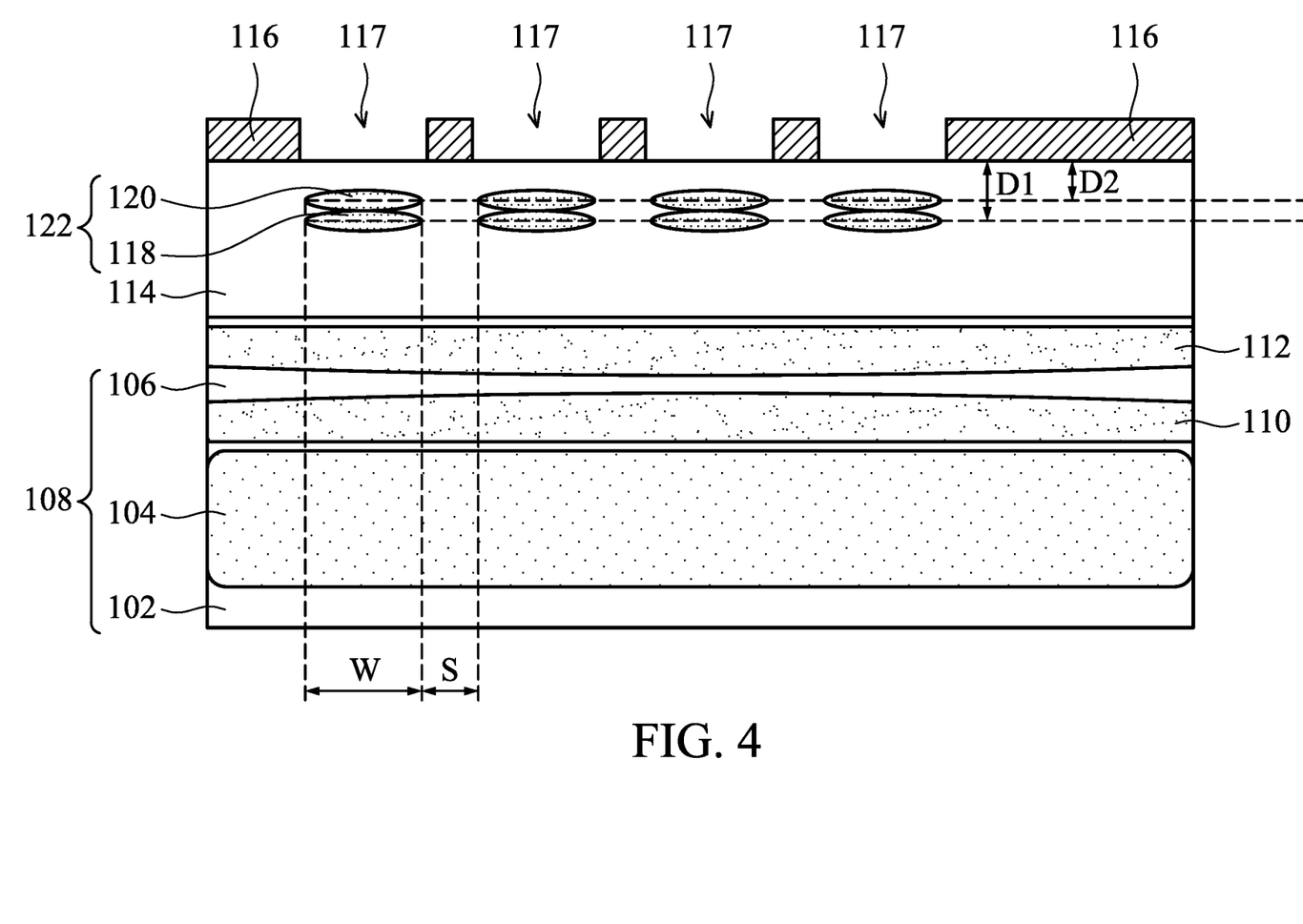

Referring to FIG. 4, a plurality of doped region pairs 122 are formed in the epitaxial layer 114. The plurality of doped region pairs 122 are arranged in a direction which is from a predetermined drain region 136 (shown in FIG. 8) toward a predetermined source region 132 (shown in FIG. 8). Each of the plurality of doped region pairs 122 includes one first doped region 118 and one second doped region 120 over the first doped region 118. The first doped region 118 and the second doped region 120 of each of the plurality of doped region pairs 122 are vertically aligned to each other. In some embodiments, the first doped region 118 and the second doped region 120 of each of the plurality of doped region pairs 122 may have substantially the same width W ranging from about 0.05 µm to about 5 µm. The plurality of doped region pairs 122 are separated from each other. In some embodiments, the plurality of doped region pairs 122 may be equally spaced. For example, the spacing S between any two neighboring doped region pairs 122 may be substantially the same and may be in a range from about 0.05 µm to about 5 µm. In some other embodiments, the plurality of doped region pairs 122 may be unequally spaced. For example, the plurality of doped region pairs 122 may be incrementally spaced from one end to the other. The first doped regions 118 of the plurality of doped region pairs 122 are located at substantially the same depth D1. The second doped regions 120 of the plurality of doped region pairs 122 are located at substantially the same depth D2.

As used herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

In some embodiments, the first doped region 118 has the second conductivity type, such as N-type and the second doped region 120 has the first conductivity type, such as P-type. In some embodiments, the dopant concentrations of first doped regions 118 of the plurality of doped region pairs 122 may be substantially the same. In some embodiments, the dopant concentrations of second doped regions 120 of the plurality of doped region pairs 122 may be substantially the same. The second doped region 120 has the same conductivity type as the epitaxial layer 114. The dopant concentration of the first doped region 118 may be greater than, less than, or equal to the dopant concentration of the epitaxial layer 114. The first doped region 118 has the opposite conductivity type as the epitaxial layer 114.

In some embodiments, the steps of forming the plurality of doped region pairs 122 may include forming a patterned mask layer 116 (such as a photoresist and/or a hard mask) having a plurality of openings 117 over the upper surface of the epitaxial layer 114, forming a plurality of first doped regions 118 by an ion implantation process through the plurality of openings 117 of the patterned mask layer 116, and forming a plurality of second doped regions 120 by another ion implantation process through the plurality of openings 117 of the patterned mask layer 116. Since the plurality of first doped regions 118 and the plurality of second doped regions 120 are formed through the same patterned mask layer 116, the first doped region 118 and the second doped region 120 of each of the plurality of doped region pairs 122 are vertically aligned to each other and have substantially the same width W. Although FIG. 4 shows that the first doped region 118 and the second doped region 120 of each of the plurality of doped region pairs 122 are in contact with each other, the first doped region 118 and the second doped region 120 of each of the plurality of doped region pairs 122 may be vertically separated from each other.

Figure 5:
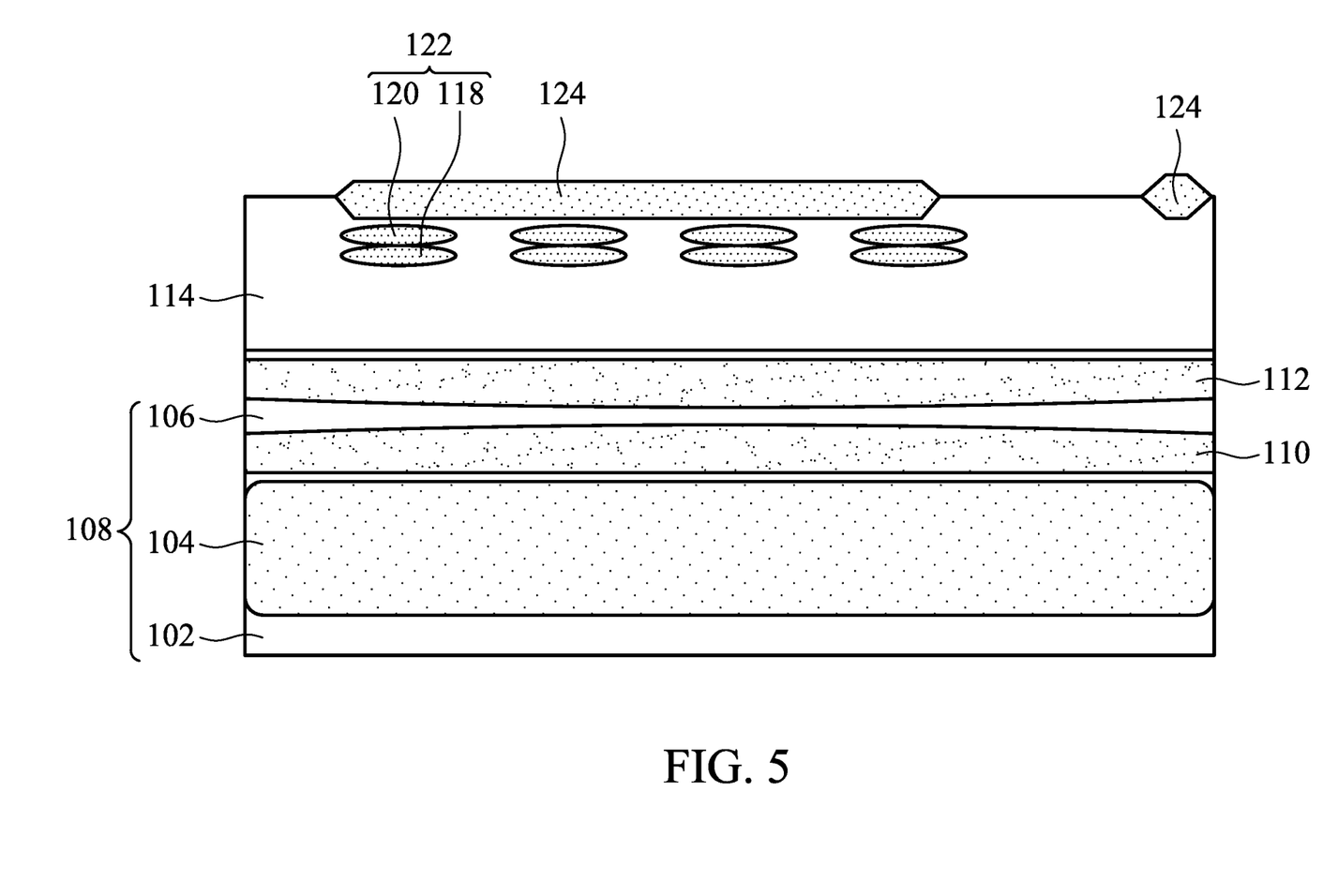

Referring to FIG. 5, an isolation structure 124 is formed embedding in the epitaxial layer 114 and adjacent to the upper surface of the epitaxial layer 114. As shown in FIG. 5, the isolation structure 124 extends over the plurality of doped region pairs 122 and encompasses all of the plurality of doped region pairs 122. The plurality of doped region pairs 122 are located adjacent to the bottom surface of the isolation structure 124. In some embodiments, one pair doped region pairs 122 may extend beyond one edge of the isolation structure 124. In some embodiments, the isolation structure 124 may be field oxide (FOX). In some embodiments, the isolation structures 124 may be local oxidation of silicon (LOCOS) or a shallow trench isolation (STI) structure. The isolation structure 124 may be made of silicon oxide, silicon nitride, silicon oxynitride, other applicable dielectric materials, or a combination thereof.

Referring to FIG. 6, a body region 128 and a drift region 126 are formed in the epitaxial layer 114 and adjacent to the upper surface of the epitaxial layer 114. In some embodiments, the body region 128 and a drift region 126 are formed to abut to each other. The plurality of doped region pairs 122 are entirely arranged in the drift region 126 and may not extend into the body region 128. The body region 128 has the second conductivity type, such as N-type, and the drift region 126 has the first conductivity type, such as P-type. The body region 128 and the drift region 126 may have a dopant concentration that is higher than that of the semiconductor layer 112. The second doped region 120 has the same conductivity type as the drift region 126. The dopant concentration of the first doped region 118 may be greater than, less than, or equal to the dopant concentration of the drift region 126. Therefore, the overall dopant concentration of some regions of drift region 126 in which the first doped regions 118 are formed is greater than the dopant concentration of some other regions of drift region 126 in which the first doped regions 118 are not formed.

In some embodiments, the body region 128 and the drift region 126 are formed by ion implantation processes through individual patterned masks. In some embodiments, the drift region 126 may be formed by one ion implantation process. In some other embodiments, the drift region 126 may be formed by multiple ion implantation processes. During the ion implanting process for forming the drift region 126, the dopants may pass through the isolation features 124, and the drift region 126 may be formed under the isolation features 124.

Referring to FIG. 7, a gate structure 130 is formed over the epitaxial layer 114 and partially covers the body region 128 and the drift region 126. The gate structure 130 extends on and partially covers the isolation features 124. In some embodiments, the gate structure 130 may include a gate dielectric layer and a gate electrode layer disposed on the gate dielectric layer (not shown). The gate dielectric layer may include silicon oxide, silicon nitride, or silicon oxynitride. The gate dielectric layer may be grown by an applicable oxidation process (such as a dry oxidation process or a wet oxidation process), a deposition process (such as a chemical vapor deposition process), other applicable processes, or a combination thereof. In some embodiments, the gate dielectric layer may be thermally grown by a thermal oxidation process in oxygen-containing ambient or nitrogen-containing ambient (such as NO or $N_2O$) to form the gate dielectric layer before forming the gate electrode layer. Alternatively, the gate dielectric layer may include a high-k dielectric layer (e.g., the dielectric constant is greater than 3.9) such as hafnium oxide ($HfO_2$). Alternatively, the high-k dielectric layer may include other high-k dielectrics such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfSiO, LaSiO, AlSiO, $BaTiO_3$, $SrTiO_3$, $Al_2O_3$, other applicable high-k dielectric materials, or a combination thereof. The high-k dielectric layer may be formed by a thermal oxidation, a deposition process (e.g., chemical vapor deposition (CVD) process, an atomic layer deposition (ALD) process, or a physical vapor deposition (PVD) process), other applicable processes, or a combination thereof.

In some embodiments, the gate electrode layer is formed on the gate dielectric layer. The gate electrode layer may be a conductive material, such as polysilicon or metal (e.g., tungsten, titanium, aluminum, copper, molybdenum, nickel, platinum, the like, or a combination thereof). The gate electrode layer may be formed by forming an electrode material by a chemical vapor deposition (CVD) process, a physical vapor deposition process (PVD), an electroplating process, an atomic layer deposition process (ALD), other applicable processes, or a combination thereof. The electrode material is then patterned by a photolithography process and an etching process to form a gate electrode.

Next, a source region 132, a drain region 136, and a bulk region 134 are formed in the epitaxial layer 114 and adjacent to the upper surface of the epitaxial layer 114. The source region 132 is formed in the body region 128, and the bulk region 134 is formed adjacent to the source region 132 in the body region 128. The source region 132 and the bulk region 134 are disposed outside the drift region 126, and the source region 132 is disposed further close to the drift region 126 than the bulk region 134. The drain region 136 is formed in the drift region 126. The source region 132 and drain region 136 have the first conductivity type, such as P-type, and the bulk region 134 has the second conductivity type, such as N-type. In some embodiments, the source region 132, the drain region 136, and the bulk region 134 are formed by ion implantation processes.

Referring to FIG. 8, an interlayer dielectric layer (ILD) 138 is formed over the epitaxial layer 114 and covers the gate structure 130, the isolation structures 124. The interlayer dielectric layer 138 may include one or more single or multiple layers of dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. The low-k dielectric materials may include, but are not limited to, fluorinated silica glass (FSG), hydrogen silsesquioxane (HSQ), carbon doped silicon oxide, amorphous fluorinated carbon, parylene, bis-benzocyclobutenes (BCB), or polyimide. The interlayer dielectric layer 138 may be formed by chemical vapor deposition (CVD) (e.g., a high-density plasma chemical vapor deposition (HDPCVD) process, an atmospheric pressure chemical vapor deposition (APCVD) process, a low-pressure chemical vapor deposition (LPCVD) process, or a plasma enhanced chemical vapor deposition (PECVD) process), a spin-on coating process, other applicable processes, or a combination thereof.

Next, an interconnect structure is formed. The interconnect structure includes a source electrode 142 and a drain electrode 144 disposed over the interlayer dielectric layer 138, and contact plugs 140 penetrating through the interlayer dielectric layer 138 and landing on the source region 132, the body region 134 and the drain region 136. The contact plugs 140 include at least three individual contact plugs 140a, 140b, and 140c. In some embodiments, the source electrode 142 is in electrical connection with the source region 132 and the bulk region 126 through the contact plugs 140a and 140b respectively, and the drain electrode 144 is in electrical connection with the drain region 136 through the contact plug 130c.

In some embodiments, the contact openings (not shown) may be formed in the interlayer dielectric layer 138 by a photolithography process (including, for example photoresist coating, soft baking, exposure, post-exposure baking, development, and so on), an etching process (such as a wet etching process, a dry etching process, another applicable technique, or a combination thereof), another applicable technique, or a combination thereof. After that, a conductive material is filled in the openings to form the contact plugs 140. In some embodiments, the conductive material of the contact plugs 140 includes metal materials (such as W, Al, or Cu), metal alloys, polysilicon, other applicable conductive materials, or a combination thereof. The contact plugs 140 may be formed by a physical vapor deposition process (PVD) (e.g., evaporation or sputtering), an electroplating process, an atomic layer deposition process (ALD), other applicable processes, or a combination thereof to deposit the conductive materials, and then optionally performing a chemical mechanical polishing (CMP) process or an etching back process to remove excess conductive materials to form the contact plugs 140.

In some embodiments, a barrier layer may be formed on the sidewalls and the bottoms of the openings before filling the conductive material of the contact plugs 140 (not shown) to prevent the conductive material of the contact plugs 140 from diffusing into the interlayer dielectric layer 138. The barrier layer may also serve as an adhesive or glue layer. The material of the barrier layer may be TiN, Ti, Ta, TaN, W, WN, other applicable materials, or a combination thereof. The barrier layer may be formed by depositing the barrier layer materials by a physical vapor deposition process (PVD) (e.g., evaporation or sputtering), an atomic layer deposition process (ALD), an electroplating process, other applicable processes, or a combination thereof.

In some embodiments, the source electrode 142 and the drain electrode 144 are formed over the interlayer dielectric layer 138. In some embodiments, the source electrode 142 and the drain electrode 144 may include Cu, W, Ag, Sn, Ni, Co, Cr, Ti, Pb, Au, Bi, Sb, Zn, Zr, Mg, In, Te, Ga, other applicable metallic materials, an alloy thereof, or a combination thereof. In some embodiments, the source electrode 142 and the drain electrode 144 may include a stacked structure of TiN/AlCu/TiN. In some embodiments, a blanket metal layer is formed on the interlayer dielectric layer 138 (not shown) by a physical vapor deposition process (PVD) (e.g., evaporation or sputtering), an electroplating process, an atomic layer deposition process (ALD), other applicable process, or a combination thereof. After that, the blanket metal layer is patterned by a patterning process to form the source electrode 142 and the drain electrode 144. In some embodiments, the patterning process may include a photolithography process (including, for example photoresist coating, soft baking, exposure, post-exposure baking, development and so on), an etching process (such as a wet etching process, a dry etching process, other applicable techniques, or a combination thereof), other applicable techniques, or a combination thereof.

In some embodiments, the contact plugs 140, the source electrode 142, and the drain electrode 144 may be formed separately. In some other embodiments, the contact plugs 140, the source electrode 142, and the drain electrode 144 may be formed simultaneously by a dual damascene process.

After the interconnect structure is formed, a semiconductor device 100 is provided. The semiconductor device 100 is a laterally diffused metal-oxide-semiconductor (LDMOS). In the embodiments of the present disclosure, the semiconductor device 100 includes the SOI substrate 108, the epitaxial layer 114, and the drift region 126. The SOI substrate 108 includes the semiconductor substrate 102, the insulating layer 104 disposed over the semiconductor substrate 102, and the semiconductor layer 106 disposed over the insulating layer 104. The epitaxial layer 114 is disposed over the SOI substrate 108. The drift region 126 is disposed in the epitaxial layer 114 and adjacent to the upper surface of the epitaxial layer 114. The epitaxial layer 114 and the drift region have a first conductivity type. The semiconductor device 100 also includes the gate structure 130, the source region 132, and the drain region 136. The gate structure 130 is disposed over the epitaxial layer 114 and partially covers the drift region 126. The source region 132 is disposed in the epitaxial layer 114 outside the drift region 126. The drain region 136 is disposed in the drift region 126. The semiconductor device 100 also includes the plurality of doped region pairs 122 which are disposed in the drift region 126 and arranged in a direction from the drain region 136 toward the source region 132. Each of the plurality of doped region pairs 122 includes the first doped region 118 and the second doped region 120 disposed over the first doped region 118. The first doped region 118 has the second conductivity type opposite to the first conductivity type, and the second doped region 120 has the first conductivity type.

The disclosed embodiments provide at least the following advantages over the conventional LDMOS device. First, the plurality of second doped regions 120 having the same conductivity type as that of the drift region 126 are disposed in the drift region 126 and adjacent to the bottom surface of the isolation structure 124, which provides a shorter path for the current to flow from the source region 132 to the drain region 136 resulting in reducing on-resistance ($R_{on}$) of the semiconductor device 100. The plurality of second doped regions 120 are located at the same depth so that the current path may be even shorter, resulting in even lower on-resistance ($R_{on}$). Second, since the plurality of first doped regions 118 have the opposite conductivity type to that of the drift region 126, the plurality of first doped regions 118 together with the drift region 126 can create a depletion region having a larger area. Therefore, the plurality of doped region pairs 122 can maintain the breakdown voltage while reducing the on-resistance of the semiconductor device 100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   an insulating layer disposed over a semiconductor substrate;
   a semiconductor layer disposed over the insulating layer, having a first conductivity type;
   an epitaxial layer disposed over the semiconductor layer, wherein the epitaxial layer has the first conductivity type;
   a drift region disposed in the epitaxial layer and adjacent to an upper surface of the epitaxial layer, wherein the drift region has the first conductivity type;
   a gate structure disposed over the epitaxial layer, wherein the gate structure partially covers the drift region;
   a source region disposed in the epitaxial layer outside the drift region;
   a drain region disposed in the drift region; and
   a plurality of doped region pairs disposed in the drift region and arranged in a direction from the drain region toward the source region, wherein each of the plurality of doped region pairs comprises:
     a first doped region having a second conductivity type opposite to the first conductivity type; and
     a second doped region disposed over the first doped region, wherein the second doped region has the first conductivity type, wherein the second doped regions of the plurality of doped region pairs are located at a same depth.

2. The semiconductor device as claimed in claim 1, wherein the plurality of doped region pairs are separated from each other by the drift region.

3. The semiconductor device as claimed in claim 1, wherein the plurality of doped region pairs are equally spaced.

4. The semiconductor device as claimed in claim 1, wherein the first doped regions of the plurality of doped region pairs are located at a same depth.

5. The semiconductor device as claimed in claim 1, wherein the first doped region and the second doped region of each of the plurality of doped region pairs are vertically aligned to each other.

6. The semiconductor device as claimed in claim 1, wherein the source region and the drain region have the first conductivity type.

7. The semiconductor device as claimed in claim 1, further comprising:
   a body region disposed in the epitaxial layer and adjacent to the drift region, wherein the body region has the second conductivity type, and the source region is disposed in the body region;
   a bulk region disposed in the body region and adjacent to the source region, wherein the bulk region has the second conductivity type,
   wherein the gate structure partially covers the body region.

8. The semiconductor device as claimed in claim 1, further comprising:
   an isolation structure disposed on the drift region, wherein the gate structure partially covers the isolation structure.

9. The semiconductor device as claimed in claim 8, wherein the plurality of doped region pairs are disposed below the isolation structure.

10. The semiconductor device as claimed in claim 1, further comprising:
    a first buried layer disposed in the semiconductor layer, wherein the first buried layer has the first conductivity type; and
    a second buried layer disposed over the first buried layer in the semiconductor layer, wherein the second buried layer has the second conductivity type.

11. A method for fabricating a semiconductor device, comprising:
    forming an insulating layer over a semiconductor substrate;
    forming a semiconductor layer over the insulating layer, wherein the semiconductor layer has a first conductivity type;
    forming an epitaxial layer over the semiconductor layer, wherein the epitaxial layer has the first conductivity type;
    forming a plurality of doped region pairs in the epitaxial layer, wherein each of the plurality of doped region pairs comprises:
      a first doped region having a second conductivity type opposite to the first conductivity type; and
      a second doped region formed over the first doped region, wherein the second doped region has a first conductivity type, and the second doped regions of the plurality of doped region pairs are located at a same depth;
    forming a drift region in the epitaxial layer and adjacent to an upper surface of the epitaxial layer, wherein the drift region has the first conductivity type and the plurality of doped region pairs are located in the drift region;
    forming a gate structure over the epitaxial layer, wherein the gate structure partially covers the drift region;
    forming a source region in the epitaxial layer outside the drift region; and
    forming a drain region in the drift region, wherein the plurality of doped region pairs are arranged in a direction from the drain region toward the source region.

12. The method as claimed in claim 11, wherein forming the plurality of doped region pairs in the epitaxial layer comprises:
    forming a plurality of the first doped regions by an implantation through a patterned mask layer; and
    forming a plurality of the second doped regions by an implantation through the patterned mask layer.

13. The method as claimed in claim 11, wherein the first doped region and the second doped region of each of the plurality of doped region pairs are aligned to each other.

14. The method as claimed in claim 11, wherein the plurality of doped region pairs are separated from each other by the drift region.

15. The method as claimed in claim 11, wherein the source region and the drain region have the first conductivity type.

16. The method as claimed in claim 11, further comprising:
    forming a body region in the epitaxial layer and adjacent to the drift region, wherein the body region has the second conductivity type, and the source region is formed in the body region;
    forming a bulk region disposed in the body region and adjacent to the source region, wherein the bulk region has the second conductivity type,
    wherein the gate structure partially covers the body region.

17. The method as claimed in claim 11, further comprising:
   forming an isolation structure on the drift region, wherein the gate structure partially covers the isolation structure.

18. The method as claimed in claim 11, further comprising:
   forming a first buried layer in the semiconductor layer, wherein the first buried layer has the first conductivity type; and
   forming a second buried layer over the first buried layer in the semiconductor layer, wherein the second buried layer has the second conductivity type.

* * * * *